United States Patent [19]
Beyer

[11] Patent Number: 6,078,670
[45] Date of Patent: Jun. 20, 2000

[54] METHOD AND ARRANGEMENT FOR REPRODUCING AUDIO SIGNALS

[75] Inventor: Detlev Beyer, Isenbüttel, Germany

[73] Assignee: Volkswagen AG, Wolfsburg, Germany

[21] Appl. No.: 08/936,677

[22] Filed: Sep. 24, 1997

[30] Foreign Application Priority Data

Sep. 28, 1996 [DE] Germany ........................... 196 40 134

[51] Int. Cl.[7] .................................. H03G 3/20; H03G 5/00
[52] U.S. Cl. .................................. 381/57; 381/86; 381/98; 381/101; 381/102; 381/104; 381/107
[58] Field of Search ................................ 381/56, 57, 95, 381/98, 101, 102, 104, 108, 109, 120, 320, 321, 86

[56] References Cited

U.S. PATENT DOCUMENTS

| | | | |
|---|---|---|---|
| 4,553,257 | 11/1985 | Mori et al. ................................ | 381/57 |
| 5,081,682 | 1/1992 | Kato et al. ................................ | 381/86 |
| 5,107,539 | 4/1992 | Kato et al. ................................ | 381/86 |
| 5,138,665 | 8/1992 | Ito .......................................... | 381/101 |
| 5,172,358 | 12/1992 | Kimura .................................... | 381/108 |
| 5,255,324 | 10/1993 | Brewer et al. ........................... | 381/107 |
| 5,434,926 | 7/1995 | Watanabe et al. ....................... | 381/108 |
| 5,450,494 | 9/1995 | Okubo et al. ............................ | 381/108 |
| 5,453,716 | 9/1995 | Person et al. ............................ | 381/107 |
| 5,666,426 | 9/1997 | Helms ...................................... | 381/104 |
| 5,771,297 | 6/1998 | Richardson .............................. | 381/57 |
| 5,892,832 | 4/1999 | Beyer et al. .............................. | 381/86 |
| 5,907,622 | 5/1999 | Dougherty ............................... | 381/108 |

FOREIGN PATENT DOCUMENTS

| | | | |
|---|---|---|---|
| 0403069 | of 0000 | European Pat. Off. . | |
| 3322055 | of 0000 | Germany . | |
| 4340167 | of 0000 | Germany . | |
| 4406352 | of 0000 | Germany . | |
| 4038805 | 7/1991 | Germany ................................... | 381/57 |
| 2207313 | 1/1989 | United Kingdom ................... | 381/107 |
| 2257317 | 1/1993 | United Kingdom ..................... | 381/98 |

*Primary Examiner*—Forester W. Isen
*Assistant Examiner*—Xu Mei
*Attorney, Agent, or Firm*—Bakers Botts L.L.P.

[57] ABSTRACT

An arrangement for reproducing audio signals includes a pitch control device for increasing or decreasing the amplification of audio signals in one or more defined frequency ranges and a volume control device for increasing and decreasing the amplification of the audio signals in a full effective frequency range of the audio signals wherein the pitch control device reduces the amplification in the defined frequency ranges if the amplification of the audio signals in the full effective frequency range is increased by the volume control device and wherein the pitch control device increases the amplification of the audio signals in the defined frequency ranges if the volume control device decreases the amplification of the audio signals in the full effective frequency range. In order to compensate for noise interference signals which occur and in order to suppress them in the audio signal sound pattern which can be heard by a human being, an additional amplification component is added to the frequency curve in at least one of the defined frequency ranges in which noise interference occurs.

23 Claims, 4 Drawing Sheets

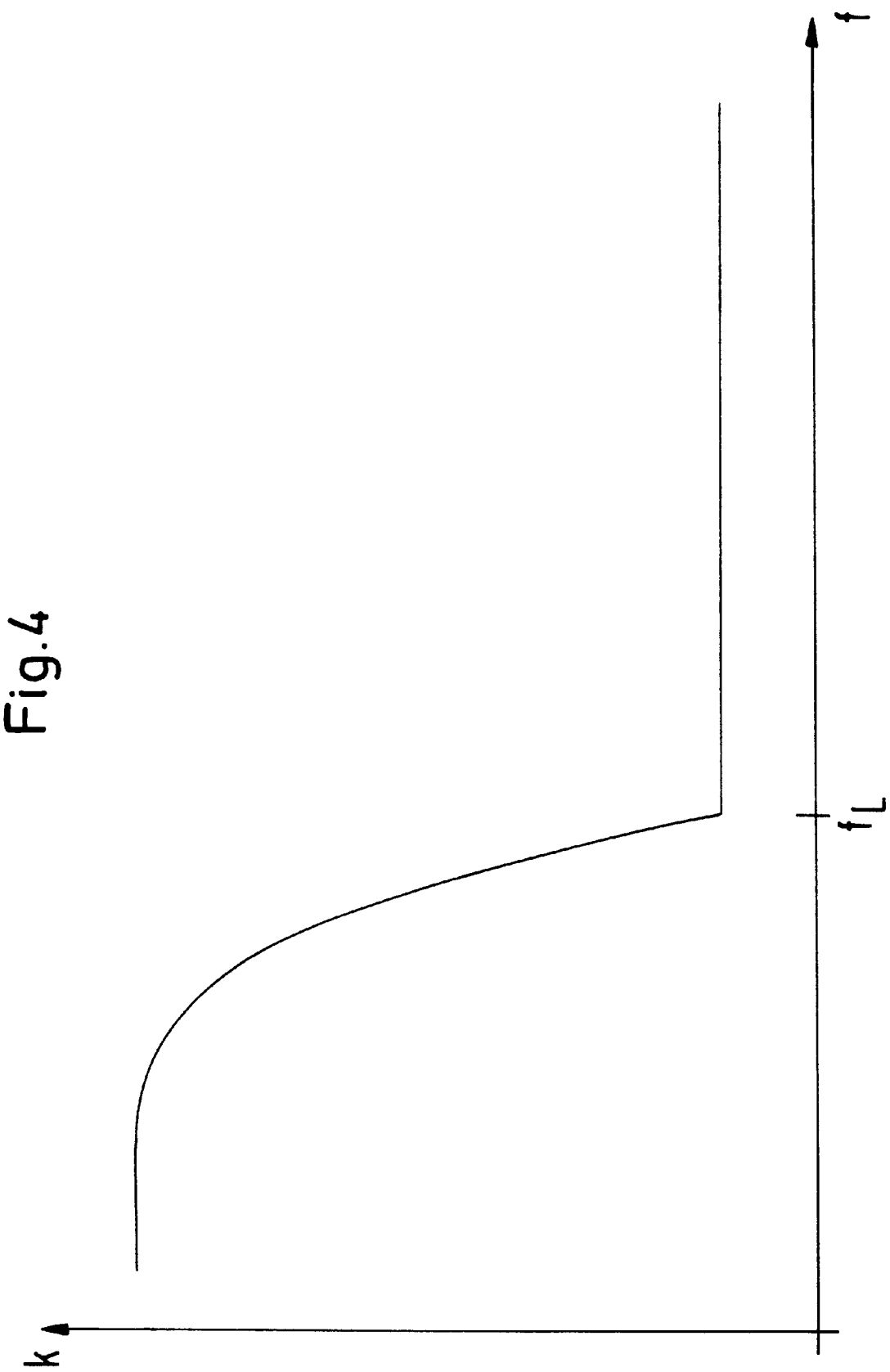

METHOD AND ARRANGEMENT FOR REPRODUCING AUDIO SIGNALS

BACKGROUND OF THE INVENTION

This invention relates to methods and arrangements for reproducing audio signals in which a pitch control device increases or decreases the amplification of the audio signals in one or more defined frequency ranges of the audio signals and a volume control device increases or decreases the amplification of the audio signals in a full effective frequency range of the audio signals.

In such arrangements the pitch control device reduces the amplification in the defined frequency ranges if the amplification of the audio signals in the full effective frequency range is increased by the volume control device and increases the amplification of the audio signals in the defined frequency ranges if the volume control device decreases the amplification of the audio signals in the full effective frequency range. In corresponding methods for reproducing audio signals the amplification of the audio signals in one or more defined frequency ranges of the audio signals can be varied, on the one hand, and the amplification of the audio signals in a full effective frequency range can be varied on the other hand, the amplification in the defined frequency ranges being reduced if the amplification in the full effective frequency range is increased and the amplification of the audio signals in the defined frequency ranges being increased if the amplification of the audio signals in the full effective frequency range is decreased.

Amplifiers for use in audio reproduction systems have pitch control devices for varying the frequency response of the amplifiers in order to set the pitch level of the reproduced sound. Graphic equalizers are used as independent circuit components for fine tuning the frequency response in the amplifier connected thereto. Human ears suffer a natural loss of pitch sensitivity at relatively low and relatively high frequencies if the volume of the reproduced sound is low. Pitch control devices are used to compensate for this tendency of the human hearing system by raising or emphasizing high and low frequencies, so that the reproduced sound, as it is heard by the human ears, has an apparently flat frequency characteristic. With a pitch control, the set frequency characteristic of an audio signal can also be set manually by using a control knob or the like, but this is independent of variations in the volume. Therefore, the set frequency characteristic of an audio signal remains unchanged when the volume of the signal is increased or decreased.

In the design of audio amplifiers, the amplification is selected so that the reproduced sound is not distorted if the volume level is at the maximum setting in order to ensure powerful impressions on the listener if the audio signal is reproduced with a high output power and the reproduced sound is subject to a degree of distortion if an additional signal is applied to the amplifier raising the signal to a level above the permitted maximum level. Such an additional signal level is present, for example, when the volume level is raised while the low frequencies are emphasized by a pitch control device.

U.S. Pat. No. 5,138,665 discloses an audio reproduction system having an audio amplifier and a pitch control unit for controlling the pitch level by increasing or decreasing the amplification or by maintaining an increased or decreased amplification of a signal in a specific frequency range of a reproduced audio signal applied thereto, and a volume control unit for increasing or decreasing the amplification of the audio signal in the full effective frequency range of the amplifier. The pitch control and volume control units are coupled to one another in such a way that the amplification which would be increased in a specific frequency range by the pitch control unit can be controlled as a function of the degree to which the amplification has been increased by the volume control unit. The pitch control and volume control units can each comprise variable resistors whose contacts are connected to one another. If the knob of the volume control unit is turned to a higher level position, the amplification of the signal in the specific frequency range is reduced by the pitch control unit. If the knob of the volume control unit is turned to a lower control position, the amplification of the signal in the specific frequency range is increased by the pitch control unit.

Although the audio reproduction system described in U.S. Pat. No. 5,138,665 avoids the disadvantage of conventional audio reproduction arrangements that the reproduced sound is not distorted by the connection of the pitch control level to the volume control, it does not, however, allow for any external noise interference, such as occurs, for example, as a result of the operation of a motor vehicle engine and drive train i.e., the drive unit, when an audio signal reproduction arrangement is used in the motor vehicle. Because of such noise, the full sound pattern which is obtained in the stationary condition of the vehicle changes during travel.

German Offenlegungsschrift No. 33 22 055 discloses a circuit arrangement for automatically adapting the volume of a loudspeaker to a noise level prevailing at the location of the loudspeaker. For mobile radio receivers, the signal level has an adjustable functional network which generates a controlled variable for a volume controller as a function of the noise interference level so that a prescribed characteristic curve, which can be modified, at least in certain sections, as a function of the activation of the volume controller, is connected to modify useful signal level at the loudspeaker as a function of the noise interference level.

German Offenlegungsschrift No. 44 06 352 describes a car radio sound reproduction device having a noise interference-dependent volume control system with an audio frequency amplifier arrangement which can be controlled as a function of external noise interferences. For example, a signal which is obtained from the tachometer of a motor vehicle is supplied to a microprocessor which controls an equalizer arranged in the audio frequency signal path of the sound reproduction device. A prescribed, vehicle-specific characteristic diagram is stored in the microprocessor and is used to vary the audio frequency response and the volume setting as a function of the engine speed.

U.S. Pat. No. 4,553,257 describes an automatic volume control device by which the level of the useful input signal and the level of the ambient noise are detected. Both levels are subjected to modification in an arithmetic circuit. The amplification of the signal level of the sound signal takes place in accordance with a multiplication operation of the useful input signal and ambient noise level.

SUMMARY OF THE INVENTION

Accordingly, it is an object of the present invention to provide a method and an arrangement for reproducing audio signals which overcomes disadvantages of the prior art.

Another object of the invention is to provide a method and arrangement for reproducing audio signals which, in addition to automatically controlling the amplification in defined frequency ranges as a function of the volume level in the full effective frequency range, also suppresses noise interference occurring in the audio-signal sound pattern which can be perceived by a human being.

These and other objects of the invention are attained by adding an additional amplification component onto the frequency curve in at least one of the defined frequency ranges, specifically in frequency ranges in which noise interference occurs. For this purpose, the arrangement according to the invention preferably has a pitch control device which can be used to vary, manually or automatically in conjunction with a volume controller, the amplification of the audio signals in the defined frequency ranges. When the audio signal arrangement is used in a motor vehicle, a defined frequency range is advantageously the frequency range in which noise interference signals caused by the drive unit occur. However, it is also possible to add the additional amplification component to the frequency curve in frequency ranges in which noise interference signals from other sources occur.

The correction of the amplification in the defined frequency ranges by adding an additional amplification component preferably takes place below the minimum frequency of the full effective frequency range of the human response frequency curve, i.e. below the so-called physiology point.

According to a further embodiment of the invention, the amplification component which can be added in the defined frequency ranges is the same at every amplification level produced by the volume control device. In this case, a compromise value which is dependent on the level of the noise interference signals is used for the amplification component which can be added. In a motor vehicle, this compromise value preferably depends on the noise signal level of the drive unit, and can therefore be fixed in a vehicle-specific fashion.

Another embodiment of the invention detects the noise interference signals and determines the defined frequency ranges in which the additional amplification component is to be added as a function of the detected noise interference. Furthermore, the pitch of the additional amplification component can be fixed as a function of the detected noise interference level.

The additional amplification component is preferably increased up to the point at which a harmonic-distortion limit value is reached. Early distortions at high amplifications in the full effective frequency range or an excessively early response of the harmonic-distortion limit value are prevented by using of a frequency-dependent harmonic-distortion limit value, preferably in the lower audio frequency range of the frequency curve.

In addition to using a manual adjustment, for example by an adjustable resistor, the amplification of the audio signals in the full effective frequency range of the frequency curve can also be set automatically as a function of the traveling speed when the arrangement is used in a motor vehicle.

By the use of the invention, in particular in an audio reproducing arrangement for a motor vehicle, the full, rounded sound pattern which is present when the motor vehicle is in a stationary state is also obtained when the motor vehicle is moving, i.e. when the drive unit is running.

BRIEF DESCRIPTION OF THE DRAWINGS

Further objects and advantages of the invention will be apparent from a reading of the following description in conjunction with the accompanying drawings, in which:

FIG. 4 is a graphical representation showing a profile of the harmonic-distortion limit value plotted against frequency.

DESCRIPTION OF PREFERRED EMBODIMENT

Figure 1:
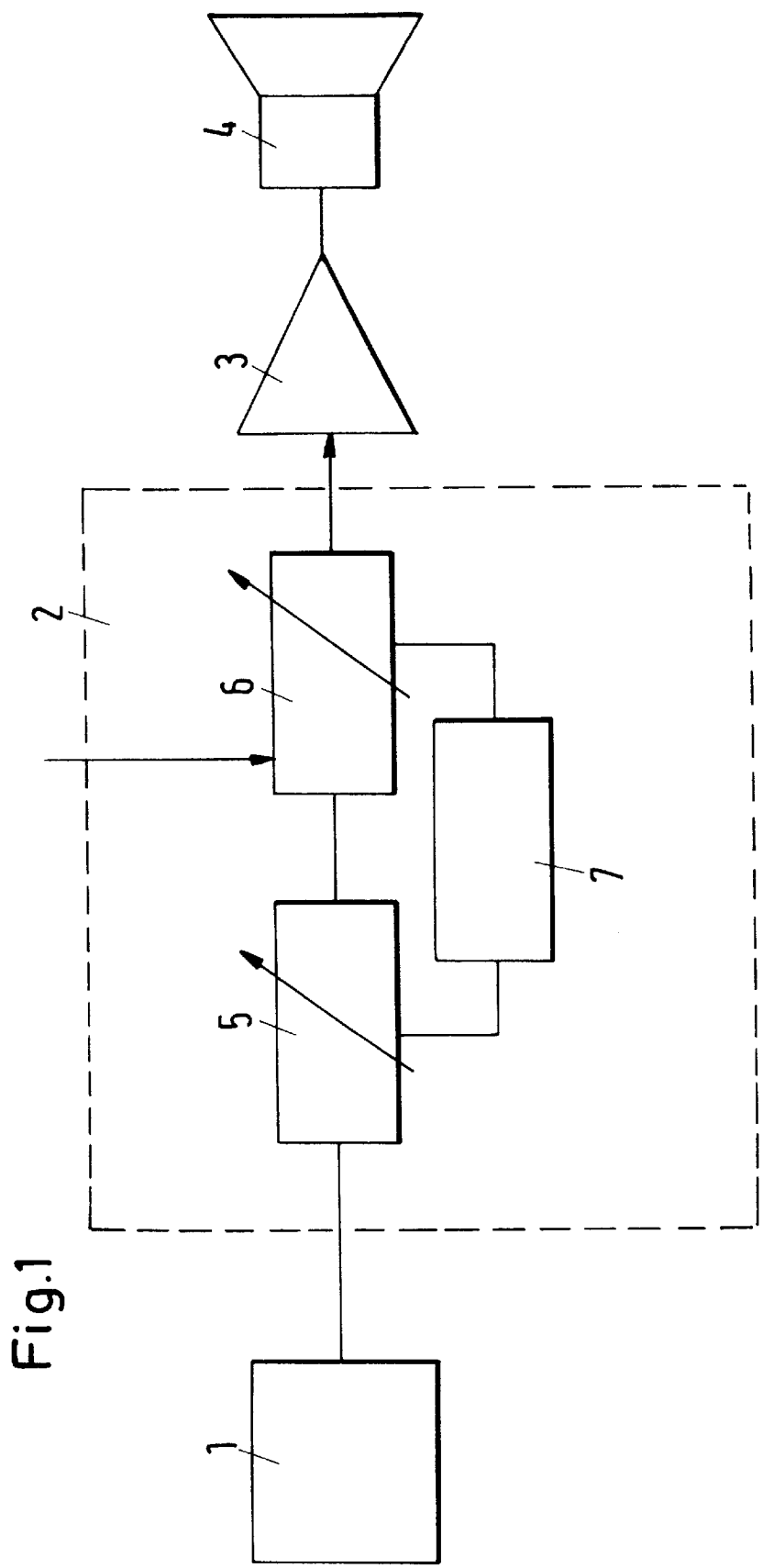
FIG. 1 is a schematic block circuit diagram illustrating a representative embodiment of an arrangement for reproducing audio signals in a motor vehicle.

The typical arrangement for reproducing audio signals according to the invention which is schematically illustrated in FIG. 1 includes an audio information reproducing unit 1, a frequency characteristic control unit 2, an amplifier 3 and a loudspeaker 4. The audio information reproducing unit 1 is connected to the frequency characteristic control unit 2 and includes a device for reading audio information which has been recorded by a recording medium or which has been made available from an external source and for converting the audio information into audio signals which are applied to the frequency characteristic control unit 2. The audio information reproducing unit 1 can be a component such as a CD player, a cassette deck or the like, which reproduces recorded audio information from a storage medium and converts the audio information into audio signals. The information reproducing unit 1 can, however, also be a device for reproducing audio information received from an external source, such as an FM/AM tuner.

The frequency characteristic control unit 2 is connected to the output of the audio information reproducing unit 1 and to the input of the amplifier 3 and controls the amplification of the audio signals in defined frequency ranges, for example the lower audio frequency range, i.e., the so-called bass range, as well as the amplification of the audio signals in the entire effective frequency range, i.e., the output volume. The audio signals with the controlled pitch and volume are applied by the frequency characteristic control unit 2 to the amplifier 3 which is connected to the loudspeaker 4. The loudspeaker 4 converts the audio signals received by the amplifier 3 into soundwaves and radiates these soundwaves.

The frequency characteristic control unit 2 contains a pitch control device 5, a volume control device 6 and an amplification device 7. The pitch control device 5 amplifies (emphasizes) or reduces (damps) the signal level of the audio signals in one or more defined frequency ranges, for example the lower audio frequency range, and applies the audio signals whose pitch has been controlled to the volume control device 6. The volume control device 6 amplifies the audio signals over the full effective frequency range, i.e. it controls the volume of the audio signals. Both the pitch control device 5 and the volume control device 7 can be controlled externally by adjustable resistors so that the user can control, on the one hand, the amplification in the defined frequency ranges by the pitch control device 5 and, on the other hand, the amplification of the audio signals over the full frequency range by the volume control device 6. Furthermore, the volume control device 6 can vary the amplification of the audio signals over the full effective frequency range as a function of the vehicle speed $V_{fahr}$ of the motor vehicle in such a way that the amplification is lower at a lower vehicle speed and higher at a high vehicle speed.

The amplification device 7 is connected to the pitch control device 5 and the volume control device 6. If the amplification over the full effective frequency range is increased by the volume control device, the amplification device 7 transmits to the pitch control device a control signal so that the latter decreases the amplification in the defined frequency ranges. If the volume control device 6 reduces the amplification over the full effective frequency range, the amplification device 7 transmits a control signal to increase the amplification in the defined frequency ranges.

Figure 2:
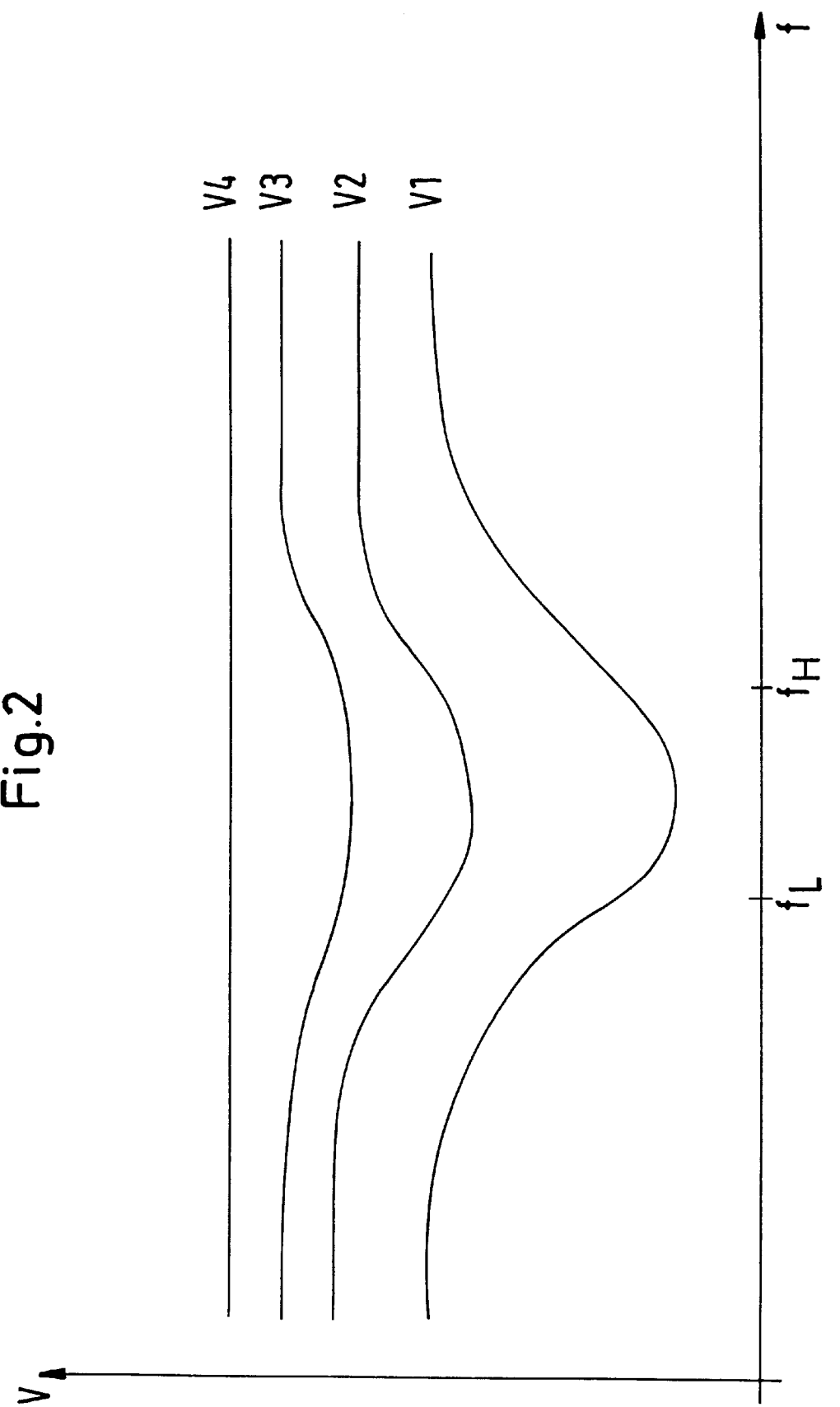
FIG. 2 is a graphical representation showing signal voltage vs. frequency curves for different amplification in the full effective frequency range without an additional amplification component.
Figure 3:
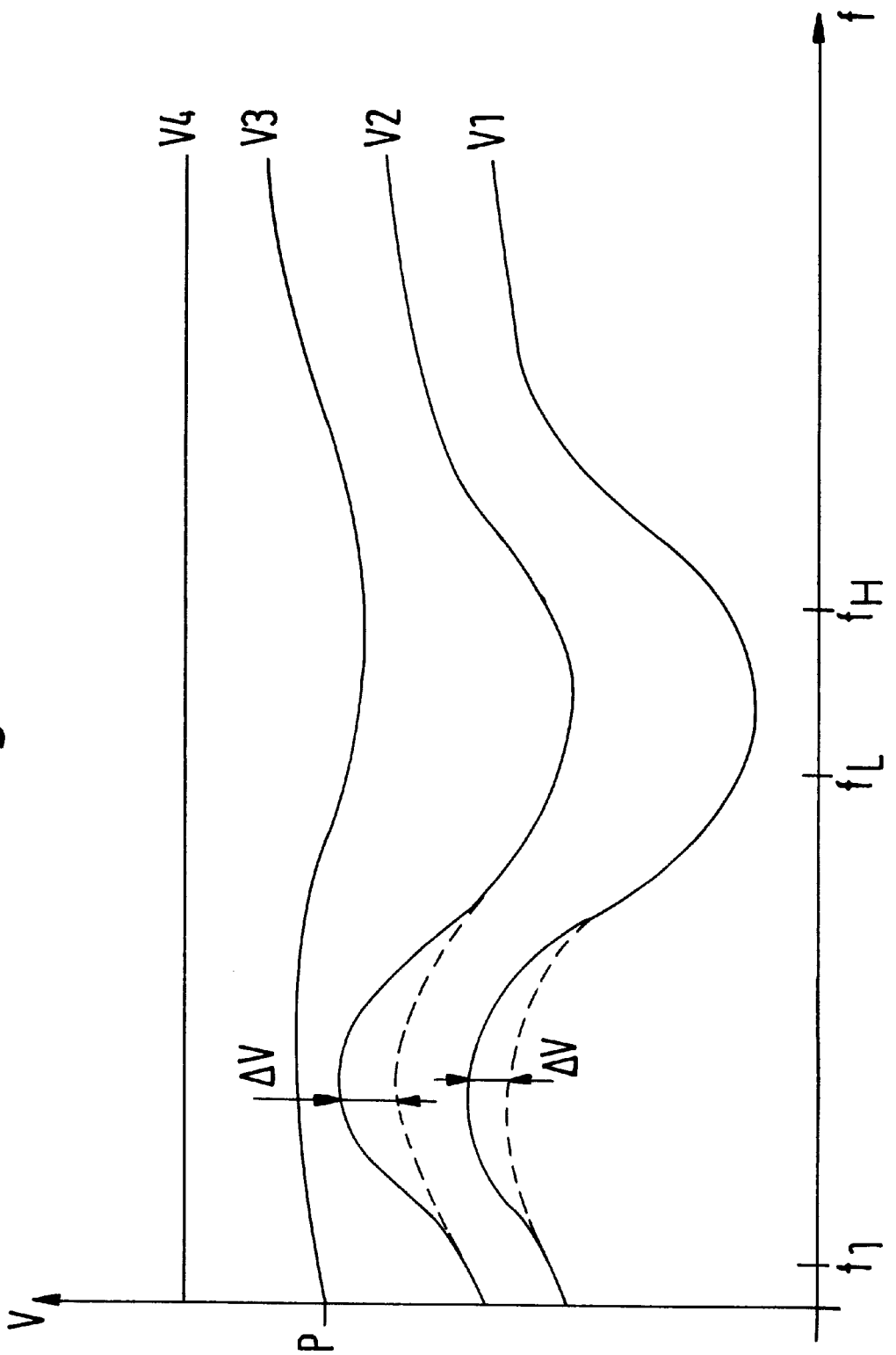
FIG. 3 is a graphical representation showing signal voltage vs. frequency curves with different amplifications in the full effective frequency range with an additional amplification component in the lower audio frequency range.

The profiles of the various frequency curves V(f) having different amplifications VI–V4 over the full effective frequency range f are illustrated in FIG. 2. In these illustrations fL designates the cut off frequency for the amplification at the lower end of the audio frequency range (bass range amplification) and fH designates the cut off frequency at the higher end of the audio frequency range amplification. If the amplification in the full effective frequency range f is shifted from a lower amplification level V1 to a higher amplification level, the emphasized level of the audio signals in the bass and higher frequency ranges, which level is determined by the pitch control device, is reduced. If the amplification over the full effective frequency range f is reduced by the volume control device, the process described above takes place in reverse.

These described profiles for the amplification control do not, however, allow for noise interference signals. When the audio signal reproduction arrangement is used in a motor vehicle, the amplification control in the stationary vehicle state, when the drive unit is not running, produces a full, rounded sound pattern, while in vehicle travel mode, i.e. when the drive unit is running, a corresponding fullness of the sound pattern is not obtained.

For this reason, in order to suppress the noise interference signals from the sound pattern which can be perceived by a human being according to the invention, a constant additional amplification component $\Delta V$ is added on by the pitch control device 5 when the amplification level is below a specific amplification level P for the full effective frequency range f of the frequency curve (physiology point) in the frequency range in which the noise interference signals occur. In the exemplary embodiment, this is the lower audio frequency range f, to fL in which noise interference occurs. The additional amplification component $\Delta V$ is added on up to the point at which the harmonic-distortion limit value is reached.

In order to avoid early distortions at high volume levels and an excessively early deactivation of the additional amplification component $\Delta V$, the harmonic-distortion limit value k is a variable as a function of the frequency in the lower audio frequency range. The corresponding curve of the harmonic distortion k is illustrated in FIG. 4 in which fL represents the cut off frequency in the lower audio frequency range.

Although the invention has been described herein with reference to a specific embodiment, many modifications and variations therein will readily occur to those skilled in the art. Accordingly, all such variations and modifications are included within the intended scope of the invention.

I claim:

1. An arrangement for reproducing audio signals comprising:
    an audio signal reproduction system for a motor vehicle including:
        a pitch control device for increasing or decreasing the amplification of audio signals in one or more defined frequency ranges of the audio signals;
        a volume control device for increasing or decreasing the amplification of the audio signals in a full effective frequency range of the audio signals;
        the pitch control device being effective to reduce the amplification in the defined frequency ranges when the amplification of the audio signals in the full effective frequency range is increased by the volume control device and to increase the amplification of the audio signals in the defined frequency ranges when the volume control device decreases the amplification of the audio signals in the full effective frequency range of the audio signals; and
        the pitch control device being further effective to add an additional predetermined amplification component in at least one of the defined frequency ranges in which noise interference signals resulting from operation of the motor vehicle occur.

2. An arrangement according to claim 1 wherein the pitch control device adds an additional amplification component in the defined frequency ranges when the amplification is below a selected amplification level of the audio signals in the full effective frequency range of the audio signals.

3. An arrangement according to claim 1 wherein the pitch control device adds an amplification component which is constant at every amplification level of the audio signals in the full effective frequency range of the audio signals.

4. An arrangement according to claim 1 wherein the pitch control device is effective to add an additional amplification component in which the pitch is fixed as a function of the level of noise interference signals.

5. An arrangement according to claim 4 including a measured value sensor for detecting noise interference signals connected to the pitch control device and wherein the pitch control device determines at least one of (a) a defined frequency range in which the additional amplification component is added and (b) the pitch of the additional amplification component.

6. An arrangement according to claim 1 wherein the pitch control device is arranged to add an additional amplification component up to a harmonic-distortion limit value.

7. An arrangement according to claim 1 wherein one of the defined frequency ranges in which the additional amplification component can be added by the pitch control device is the lower audio frequency range.

8. An arrangement according to claim 7 wherein the harmonic-distortion limit value is variable in the lower audio frequency range.

9. An arrangement according to claim 8 wherein the harmonic-distortion limit value is fixed as a function of the frequency.

10. An arrangement according to claim 1 wherein the pitch control device is connected to at least one control device by which the amplification of the audio signals can be adjusted manually in one or more of the defined frequency ranges.

11. An arrangement according to claim 1 wherein the volume control device is connected to a manual control by which the amplification of the audio signals can be adjusted manually in the full effective frequency range of the audio signals.

12. A motor vehicle containing the arrangement according to claim 1.

13. A motor vehicle according to claim 12 wherein noise interference signals are produced by the drive unit of the motor vehicle.

14. A motor vehicle according to claim 12 wherein the volume control device adjusts the amplification of the audio signals in the full effective frequency range of the audio signals as a function of the travel speed of the motor vehicle.

15. A method for reproducing audio signals in an audio signal reproduction system in a motor vehicle wherein the amplification of the audio signals in one or more defined frequency ranges of the audio signals as well as the amplification of the audio signals in a full effective frequency range of the audio signals can be varied and wherein the amplification in the defined frequency ranges is reduced if the amplification of the audio signals in the full effective frequency range is increased, and the amplification of the audio signals in the defined frequency ranges is increased if the amplification of the audio signals in the full effective frequency range is decreased, the method comprising:

adding additional predetermined amplification of the audio frequency signals in at least one of the defined frequency ranges in which noise interference signals resulting from operation of the motor vehicle occur.

16. A method according to claim 15 wherein the additional amplification component is added in the defined frequency range when the amplification level is below a defined amplification of the audio signals in the full effective frequency range of the audio signals.

17. A method according to claim 15 wherein the amplification component which is added in the defined frequency range is constant at every amplification level of the audio signals for the full effective frequency range of the audio signals.

18. A method according to claim 15 wherein pitch of the additional amplification component is fixed as a function of the pitch of the noise interference signals.

19. A method according to claim 15 including the steps of detecting the noise interference which occurs and determining at least one of (a) a defined frequency range in which the additional amplification component is added and (b) the pitch of the additional amplification component, as a function of the detected noise interference.

20. A method according to claim 15 wherein the additional amplification component is added up to a harmonic-distortion limit value.

21. A method according to claim 15 wherein one of the defined frequency ranges in which the additional amplification component is added is the lower audio frequency range of the audio signals.

22. A method according to claim 21 wherein the harmonic-distortion limit value is variable in the lower audio frequency range.

23. A method according to claim 22 wherein the harmonic-distortion limit value is fixed as a function of the frequency.

* * * * *